United States Patent
Ueno

(10) Patent No.: US 9,270,106 B2
(45) Date of Patent: Feb. 23, 2016

(54) TEMPERATURE PROTECTION DEVICE OF ELECTRONIC DEVICE

(71) Applicant: PANASONIC CORPORATION, Osaka (JP)

(72) Inventor: Hirofumi Ueno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 43 days.

(21) Appl. No.: 14/103,675

(22) Filed: Dec. 11, 2013

(65) Prior Publication Data

US 2014/0177121 A1    Jun. 26, 2014

(30) Foreign Application Priority Data

Dec. 20, 2012 (JP) ................................ 2012-277787
Aug. 21, 2013 (JP) ................................ 2013-171028

(51) Int. Cl.
| | |
|---|---|
| H02H 5/04 | (2006.01) |
| H01H 31/12 | (2006.01) |
| H02H 3/44 | (2006.01) |
| H02K 11/00 | (2006.01) |
| H01M 2/34 | (2006.01) |
| H03K 17/08 | (2006.01) |

(52) U.S. Cl.
CPC ............... *H02H 5/04* (2013.01); *H01H 31/122* (2013.01); *H01M 2/348* (2013.01); *H02H 3/44* (2013.01); *H02K 11/0047* (2013.01); *H03K 2017/0806* (2013.01)

(58) Field of Classification Search
USPC ................................ 361/93.8, 103, 106, 104
See application file for complete search history.

(56) References Cited

U.S. PATENT DOCUMENTS

| | | | |
|---|---|---|---|
| 6,172,482 B1 * | 1/2001 | Eguchi | 320/134 |
| 6,791,809 B2 * | 9/2004 | Pannwitz | 361/90 |
| 8,049,469 B2 * | 11/2011 | Kim | 320/153 |
| 2007/0188148 A1 * | 8/2007 | Kawasumi et al. | 320/134 |
| 2011/0050175 A1 * | 3/2011 | Odaohhara et al. | 320/134 |

FOREIGN PATENT DOCUMENTS

| | | |
|---|---|---|
| JP | 02-114893 A | 4/1990 |
| JP | 03-277137 A | 12/1991 |
| JP | 2002-281660 A | 9/2002 |

* cited by examiner

*Primary Examiner* — Danny Nguyen
(74) *Attorney, Agent, or Firm* — McDermott Will & Emery LLP

(57) ABSTRACT

A temperature protection device of an electronic device according to the present technology is inserted and connected in a current-carrying circuit between a power supply unit and an electronic device main body in which a temperature detecting element is installed, and includes a first switch inserted and connected in series in the current-carrying circuit from the power supply unit to the electronic device main body, a cutoff unit for controlling on/off of the first switch, a current fusing element of which one end is connected to the current-carrying circuit to the electronic device main body, a second switch connected to the other end of the current fusing element, and a controller for controlling on/off of the second switch based on a temperature detection signal from the temperature detecting element.

3 Claims, 5 Drawing Sheets

TEMPERATURE PROTECTION DEVICE OF ELECTRONIC DEVICE

RELATED APPLICATIONS

This application claims the benefit of Japanese Application No. 2012-277787, filed on Dec. 20, 2012 and Japanese Application No. 2013-171028, filed on Aug. 21, 2013, the disclosure of which Application is incorporated by reference herein.

BACKGROUND OF THE INVENTION

1. Field of the Invention

The present technology relates to a temperature protection device of an electronic device, such as a display device that includes a liquid crystal display element.

2. Background Art

A display device that includes a liquid crystal display element, such as a viewfinder, may be used in a low-temperature environment, such as an environment at a minus outside temperature.

An optimal driving voltage of a liquid crystal display element for display in an optimal condition varies with ambient temperature, which leads to low responsivity in a low-temperature condition and visibility degradation as a display device. For this reason, when used in a low-temperature environment, the liquid crystal display element is heated with a heater to prevent visibility degradation as a display device.

Generally, in an electronic device that includes a heat-generating component, such as a heater, in order to protect the electronic device from thermal runaway of the electronic device due to abnormality in a controller or other problems, a thermal fuse is installed near the heat-generating component in the electronic device. When abnormality occurs, the thermal fuse cuts off electric current flowing through the heat-generating component.

Unexamined Japanese Patent Publication No. H02-114893 discloses a technology to sense an abnormal high-temperature condition of a motor with a thermistor, to short-circuit a switching element, and to blow out a fusing resistor.

SUMMARY OF THE INVENTION

A temperature protection device of an electronic device according to the present technology is inserted and connected in a current-carrying circuit between a power supply unit of an electronic device and an electronic device main body in which a temperature detecting element is installed. The temperature protection device of the electronic device includes a first switch inserted and connected in series in the current-carrying circuit from the power supply unit to the electronic device main body, a cutoff unit for controlling on/off of the first switch, a current fusing element of which one end is connected to the current-carrying circuit to the electronic device main body, a second switch connected to the other end of the current fusing element, and a controller for controlling on/off of the second switch based on a temperature detection signal from the temperature detecting element in the electronic device main body. When the temperature detection signal shows an abnormal condition, the controller turns on the second switch for supplying electric current to the current fusing element to cause a blowout. The cutoff unit turns off the first switch for cutting off the current-carrying circuit in response to the blowout of the current fusing element.

DETAILED DESCRIPTION OF THE INVENTION

With reference to the drawings, a temperature protection device of an electronic device according to the present technology will be described below by taking a display device of a video camera device as an example. However, an unnecessarily detailed description may be omitted. For example, a detailed description of a well-known matter and a repeated description of a substantially identical configuration may be omitted. The purpose for this is to prevent the following description from being unnecessarily redundant and to allow those skilled in the art to easily understand the present technology.

The applicant provides the accompanying drawings and the following description in order that those skilled in the art may fully understand the present disclosure. These are not intended to limit the subject described in the claims.

First Exemplary Embodiment

Figure 1:
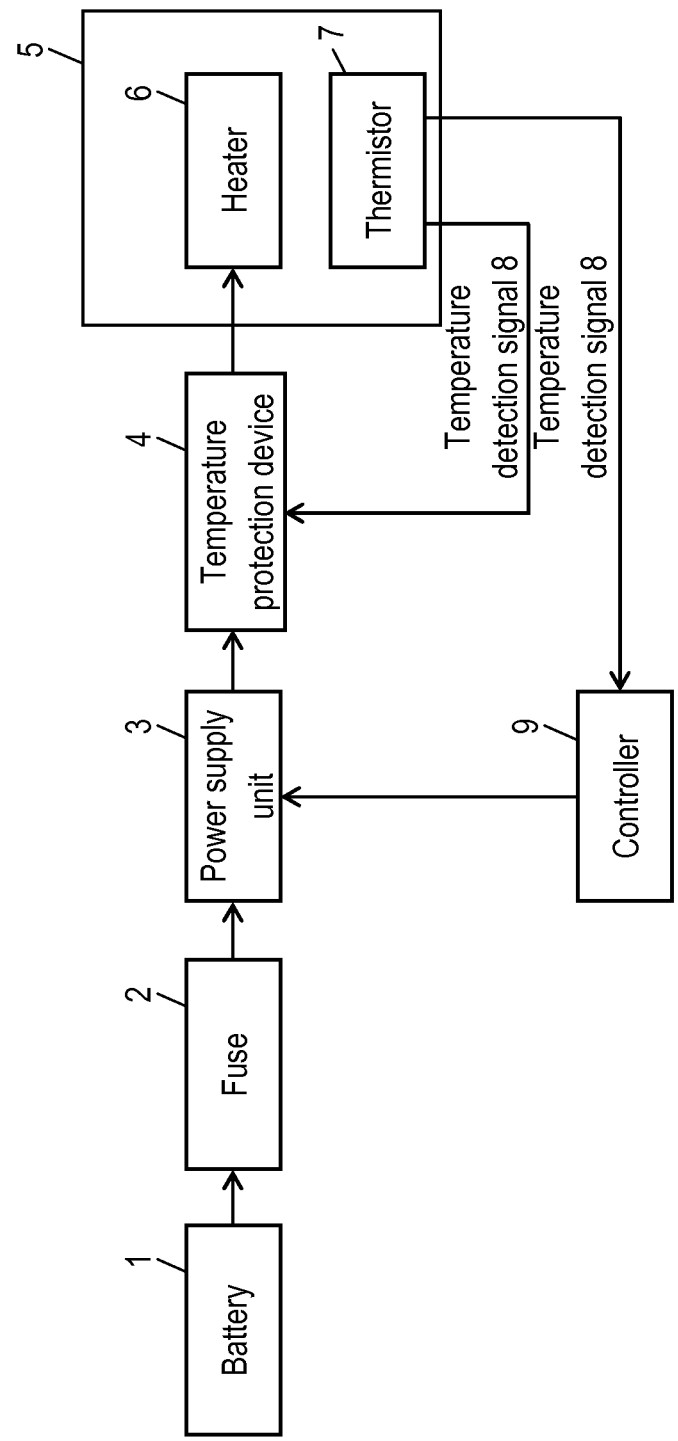
FIG. 1 is a block diagram illustrating a configuration of a display device portion used in a video camera device according to a first embodiment of the present technology.

FIG. 1 is a block diagram illustrating a configuration of a display device portion used in a video camera device according to a first embodiment of the present technology.

As illustrated in FIG. 1, a power supply voltage of battery 1 which functions as a direct-current (DC) power supply is provided to power supply unit 3 that includes a DC-DC converter, via current fuse 2. Power supply unit 3 increases the voltage to a predetermined voltage and provides the voltage, via temperature protection device 4, to display device 5 which functions as an electronic device main body such as a viewfinder that includes a liquid crystal display element. Specifically, power supply unit 3 provides the voltage to heater 6 which functions as a heating unit in display device 5. Temperature protection device 4 is inserted and connected in the current-carrying circuit between power supply unit 3 and heater 6 of display device 5 which is an electronic device main body.

Thermistor 7 which functions as a temperature detecting element is installed near heater 6 of display device 5. Temperature detection signal 8 outputted from thermistor 7 is provided to temperature protection device 4 and controller 9. Controller 9 controls electric current flowing through heater 6 by controlling an output voltage of power supply unit 3 based on temperature detection signal 8 from thermistor 7.

Battery 1 may be a DC power supply that converts commercial alternating current (AC) power into a DC voltage by a device such as an AC adapter. Current fuse 2 serves as a protection circuit for an entire electronic circuit including the display device. When an abnormal current is detected, current fuse 2 cuts off electric current flowing through the electronic circuit. Controller 9 may be configured to control on/off of electric power to heater 6 by controlling on/off of output of power supply unit 3. Controller 9 may be configured to control electric current flowing through heater 6 by controlling an output current of power supply unit 3.

Next, temperature protection device 4 will be described.

Figure 2:
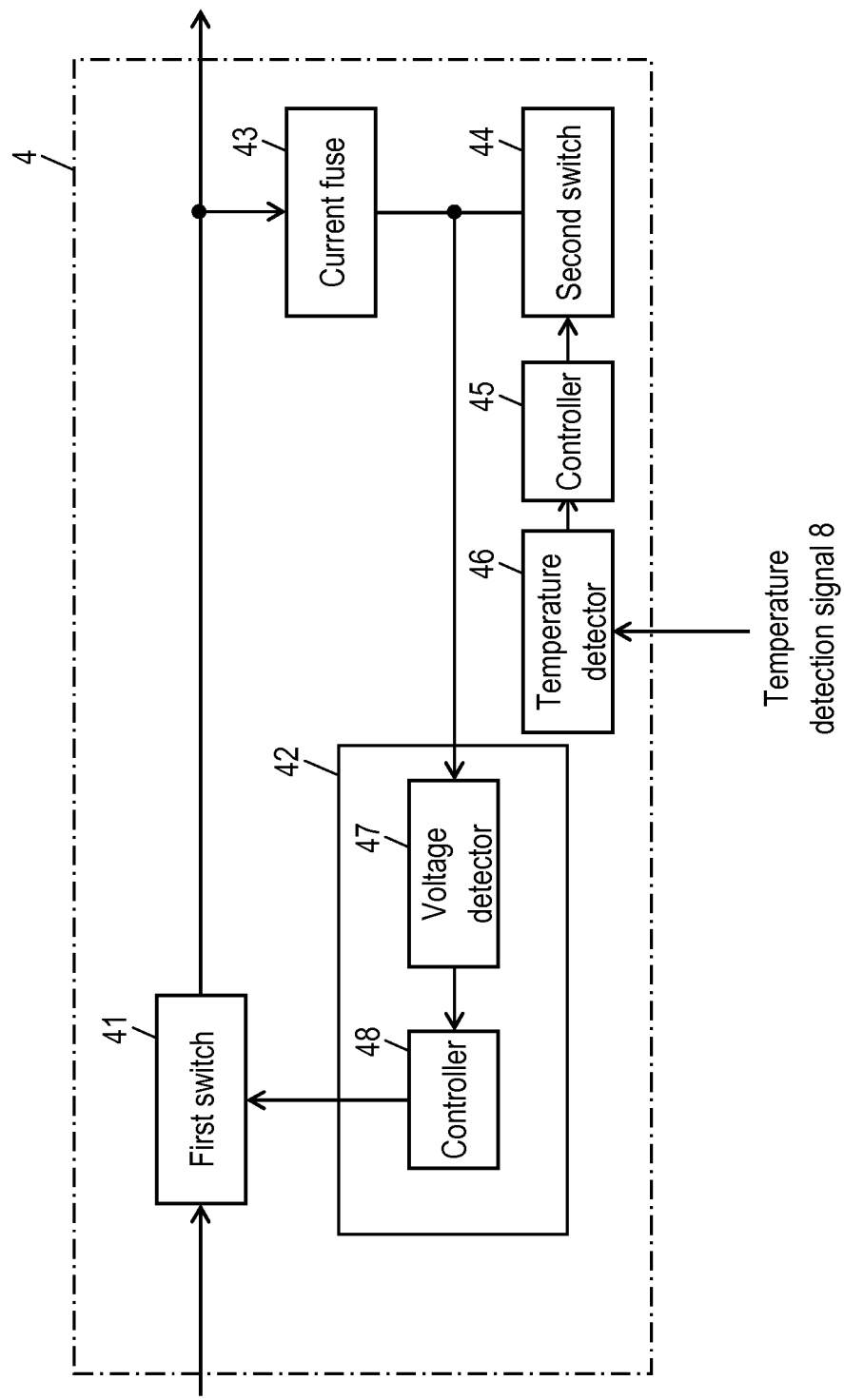
FIG. 2 is a block diagram illustrating an example of a temperature protection device.

FIG. 2 is a block diagram illustrating an example of temperature protection device 4. As illustrated in FIG. 2, temperature protection device 4 includes first switch 41, cutoff unit 42, current fuse 43, second switch 44, and controller 45. First switch 41 includes a semiconductor switch, such as a field effect transistor (FET), inserted and connected in series in the current carrying circuit from power supply unit 3 to heater 6. Cutoff unit 42 controls on/off of first switch 41. Current fuse 43 is a current fusing element of which one end is connected to the current carrying circuit to heater 6. Second switch 44 includes a semiconductor switch, such as an FET, inserted and connected between the other end of current fuse 43 and a grounded circuit, etc. Controller 45 controls on/off of second switch 44 based on temperature detection signal 8 from thermistor 7 which functions as a temperature detecting element. Second switch 44 is a normally-off switch.

Controller 45 is provided with an output signal of temperature detector 46. Temperature detection signal 8 from thermistor 7 which functions as a temperature detecting element is inputted into temperature detector 46. Temperature detector 46 provides a signal to controller 45 when temperature detection signal 8 indicating abnormality, for example, temperature detection signal 8 indicating an abnormal heat generating condition is inputted, and when thermistor 7 fails and abnormal temperature detection signal 8 is inputted. This causes controller 45 to turn on second switch 44, pass electric current through current fuse 43, and thereby blow out current fuse 43 when the electronic device is in an abnormal condition such as an abnormal heat generating condition of heater 6 and a failure in thermistor 7.

Cutoff unit 42 includes voltage detector 47 for detecting a voltage variation at a connection point of current fuse 43 and second switch 44, and controller 48 to which an output signal of voltage detector 47 is provided, controller 48 controlling on/off of first switch 41. Voltage detector 47 provides a signal to controller 48 and changes first switch 41 into an off mode when current fuse 43 blows out and a predetermined voltage is no longer detected at the connection point of current fuse 43 and second switch 44. This cuts off the current carrying circuit from power supply unit 3 to heater 6 and stops electric current flowing through heater 6.

Figure 3:
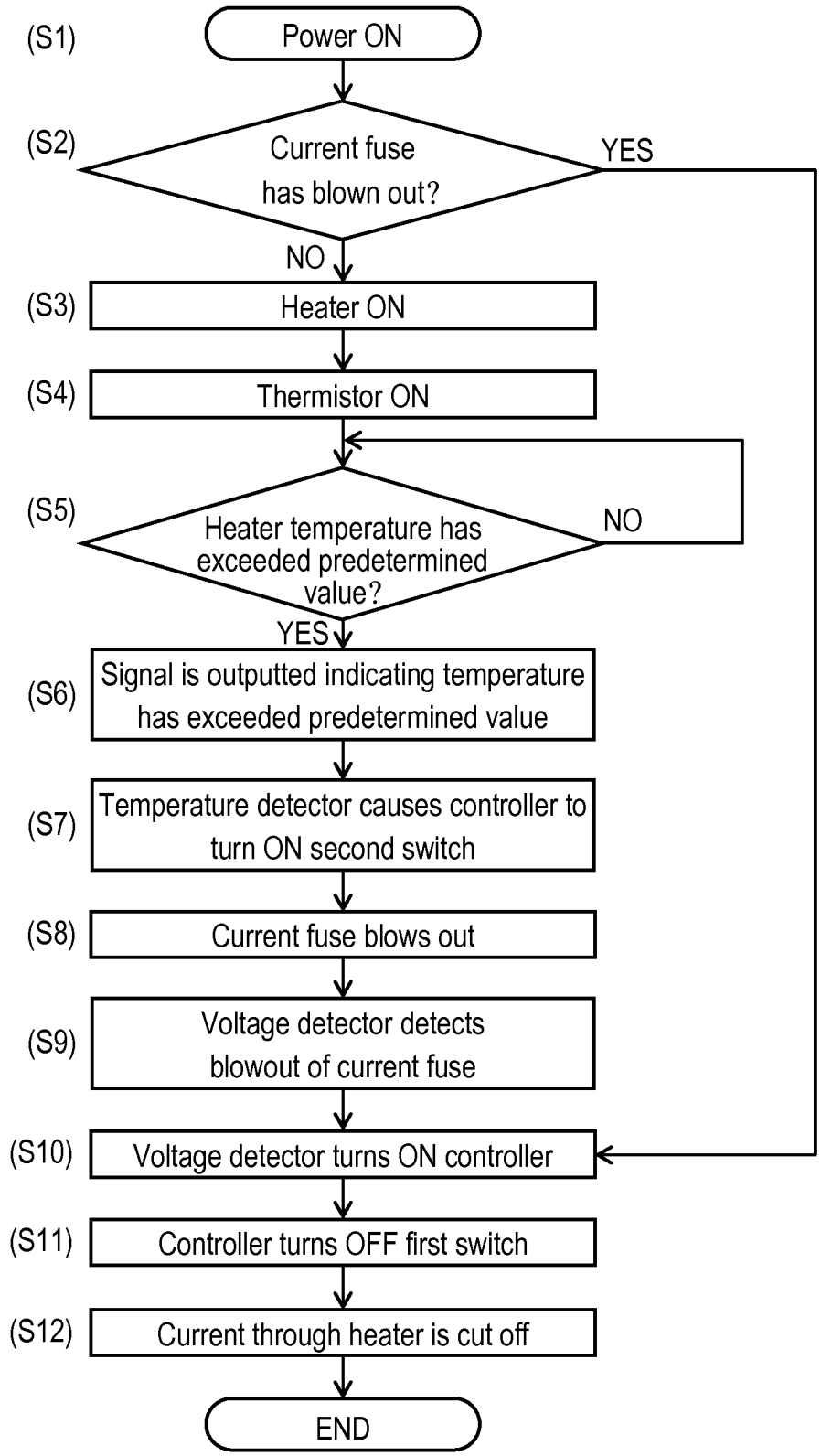
FIG. 3 is a flowchart for describing an operation of the temperature protection device illustrated in FIG. 2.

FIG. 3 is a flowchart for describing an operation of the temperature protection device illustrated in FIG. 2.

As illustrated in FIG. 3, first, a user turns on power of a video camera device main body (S1). This causes a microcomputer as a controller of an entire device to perform a check process (S2) of whether current fuse 43 of temperature protection device 4 has blown out. When current fuse 43 has not blown out (NO at S2), electric power is provided to heater 6 and thermistor 7 (S3) (S4).

Thermistor 7 performs temperature detection and outputs temperature detection signal 8 which is inputted into temperature detector 46. Temperature detector 46 performs a check process (S5) of whether the temperature has exceeded a predetermined value based on temperature detection signal 8. When the temperature having exceeded the predetermined value is detected (YES at S5), temperature detector 46 outputs to controller 45 a signal indicating that the temperature has exceeded the predetermined value (S6). This causes controller 45 to turn on second switch 44 (S7). In contrast, when in the check process (S5) of temperature detector 46 the temperature is determined to have not exceeded the predetermined value (NO at S5), temperature detector 46 continues to perform the check process (S5) based on temperature detection signal 8.

When second switch 44 turns on, electric current flows through current fuse 43. Current fuse 43 then blows out (S8) because the electric current flowing through current fuse 43 at this time is configured to be a current equal to or higher than a rated value at which current fuse 43 blows out. Voltage detector 47 in cutoff unit 42 which detects the voltage at the connection point of current fuse 43 and second switch 44 detects a blowout of current fuse 43 (S9) by a voltage change at the connection point of current fuse 43 and second switch 44 caused by the blowout of current fuse 43. Subsequently, voltage detector 47 provides a signal that turns on controller 48 (S10). Controller 48 then turns off first switch 41 (S11). This cuts off the current-carrying circuit from power supply unit 3 to heater 6, and stops electric current flowing through heater 6 (S12).

In addition, when it is determined in the check process (S2) of current fuse 43 that current fuse 43 has already blown out (YES at S2), the process then moves to an operation in which voltage detector 47 provides a signal that turns on controller 48. An operation flow is then performed in which controller 48 turns off first switch 41, the current-carrying circuit from power supply unit 3 to heater 6 is cut off, and electric current does not flow through heater 6.

As described above, the temperature protection device according to the present technology is inserted and connected in the current-carrying circuit between power supply unit 3 and heater 6 of display device 5 in which thermistor 7 which functions as a temperature detecting element is installed. The temperature protection device according to the present technology includes first switch 41 inserted and connected in series in the current-carrying circuit from power supply unit 3, cutoff unit 42 for controlling on/off of first switch 41, current fuse 43 that functions as a current fusing element of which one end is connected to the current-carrying circuit, second switch 44 connected to the other end of the current fuse 43, and controller 45 for controlling on/off of second switch 44 based on the temperature detection signal from thermistor 7. When the temperature detection signal shows an abnormal heat-generating condition, controller 45 turns on second switch 44 for supplying electric current to current fuse 43 to cause a blowout.

Cutoff unit 42 is configured to turn off first switch 41 for cutting off the current-carrying circuit when current fuse 43 blows out.

This may provide a protection device having a simple configuration and performing an operation equivalent to that of a thermal fuse without using a thermal fuse. In addition, this allows a reliable operation as a protection device because controller 45 passes electric current through current fuse 43, blows out current fuse 43, and stops electric current to the electronic device main body when an abnormal heat-generating condition is detected. Furthermore, this allows use of an element having a small fusing current as current fuse 43 and also allows an inexpensive device configuration, because current fuse 43 is not inserted or connected in the current-carrying circuit to the electronic device main body.

Second Exemplary Embodiment

Figure 4:
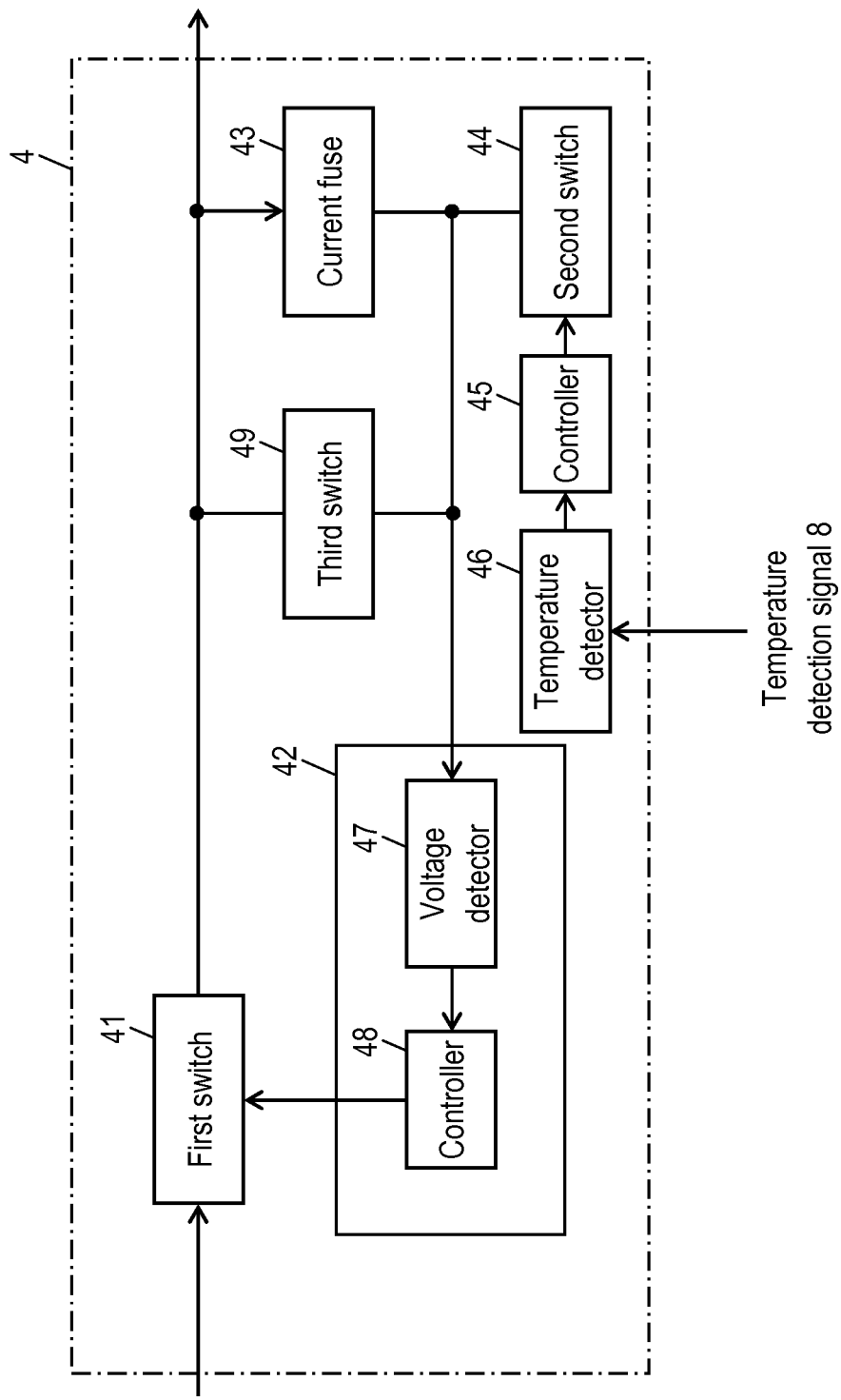
FIG. 4 is a block diagram illustrating an example of the temperature protection device according to a second embodiment of the present technology.

FIG. 4 is a block diagram illustrating an example of a temperature protection device 4 according to a second embodiment of the present technology. In FIG. 4, similar reference numerals are used for components identical to those illustrated in FIG. 2.

As illustrated in FIG. 4, current fuse 43 which functions as a current fusing element has normally-off third switch 49 connected in parallel with current fuse 43. Third switch 49 is a restoration switch for temporarily restoring an operation depending on a user's determination without replacing current fuse 43 after current fuse 43 blows out. A turn-on of third switch 49 causes voltage detector 47 to provide a signal to controller 48 and turn on first switch 41. This causes the cutoff condition of the current-carrying circuit from power supply unit 3 to heater 6 to be canceled, and allows electric current to flow through heater 6.

Figure 5:
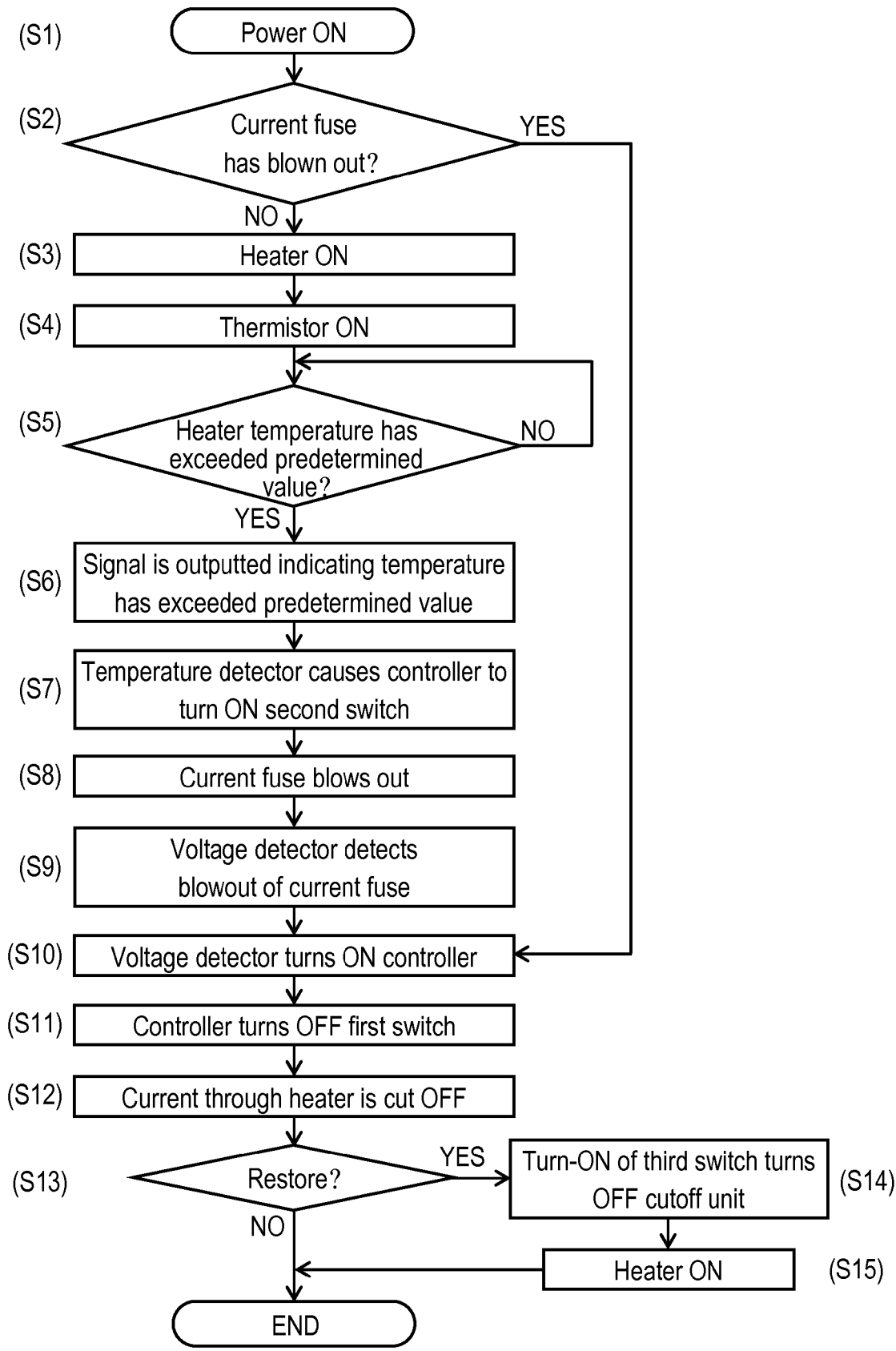
FIG. 5 is a flowchart for describing an operation of the temperature protection device illustrated in FIG. 4.

FIG. 5 is a flowchart for describing an operation of the temperature protection device illustrated in FIG. 4. In FIG. 5, similar reference numerals are used for components identical to those in the operation flow illustrated in FIG. 3. That is, in an operation flow S1 to S12 in FIG. 5, the temperature protection device performs an operation identical to that in the operation flow S1 to S12 in FIG. 3.

As illustrated in FIG. 5, after the current-carrying circuit from power supply unit 3 to heater 6 is cut off and electric current flowing through heater 6 is stopped (S12), in a determination process (S13) of whether to restore the operation for heater 6, when it is determined to restore the operation (YES at S13), a turn-on of third switch 49 causes cutoff unit 42 to be turned off and first switch 41 to be turned on again. This causes the cutoff condition of the current-carrying circuit from power supply unit 3 to heater 6 to be canceled, and allows electric current to flow through heater 6.

In the determination process (S13) of whether to restore the operation for heater 6, when it is determined not to restore the operation (NO at S13), third switch 49 maintains the off mode.

The temperature protection device according to the present embodiment may also provide a protection device having a simple configuration and performing an operation equivalent to that of a thermal fuse without using a thermal fuse. In addition, the temperature protection device according to the present embodiment allows a reliable operation as a protection device because controller 45 passes electric current through current fuse 43, blows out current fuse 43, and stops electric current to the electronic device main body when an abnormal heat-generating condition is detected. Furthermore, the temperature protection device according to the present embodiment allows use of an element having a small fusing current as current fuse 43 and also allows an inexpensive device configuration, because current fuse 43 is not inserted or connected in the current-carrying circuit to the electronic device main body.

The above-described embodiments have described an example of a current fuse as a current fusing element. The current fusing element is not limited to a current fuse if the element blows out and can change a circuit to an open circuit by a flow of electric current exceeding a rated value, such as a fuse resistor. In addition, the temperature detecting element is not limit to a thermistor if the element has a temperature detecting function.

As described above, with reference to the accompanying drawings and detailed description, the embodiments considered to be a best mode have been provided. These embodiments have been provided for the purpose of illustrating the subject described in the claims to those skilled in the art with reference to the specific embodiments. Therefore, various modifications, substitutions, additions, and exclusions can be made to the above embodiments within the scope of the claims and equivalents thereof.

The present technology can provide a temperature protection device that protects an electronic device from an abnormal temperature condition such as thermal runaway. The present invention is useful for improving safety of an electronic device including a heat-generating portion, such as a ceramic heater, a hot water heater, and a kotatsu.

What is claimed is:

1. A temperature protection device of an electronic device, the temperature protection device to be inserted and connected in a current-carrying circuit between a power supply unit of the electronic device and an electronic device main body in which a temperature detecting element is installed, the temperature protection device comprising:
    a first switch inserted and connected in series in the current-carrying circuit from the power supply unit to the electronic device main body;
    a cutoff unit for controlling on/off of the first switch;
    a current fusing element of which one end is connected to the current-carrying circuit to the electronic device main body and to the first switch;
    a second switch connected to an other end of the current fusing element; and
    a controller for controlling on/off of the second switch based on a temperature detection signal from the temperature detecting element of the electronic device main body,
    wherein when the temperature detection signal shows an abnormal condition, the controller turns on the second switch for supplying electric current to the current fusing element to cause a blowout; and
    the cutoff unit turns off the first switch for cutting off the current-carrying circuit in response to the blowout of the current fusing element.

2. The temperature protection device of the electronic device according to claim 1, wherein the second switch is a normally-off switch.

3. The temperature protection device of the electronic device according to claim 1, wherein the current fusing element has a normally-off third switch connected in parallel with the current fusing element; and
    the third switch is turned on by a user after the current fusing element blows out.

* * * * *